(12) United States Patent
Eldin et al.

(10) Patent No.: US 7,373,538 B1
(45) Date of Patent: May 13, 2008

(54) METHOD FOR DETERMINING INTERCONNECT LINE PERFORMANCE WITHIN AN INTEGRATED CIRCUIT

(75) Inventors: Tarek Eldin, San Jose, CA (US); Himanshu J. Verma, Mountain View, CA (US); Feng Wang, San Jose, CA (US); Eric J Thorne, Santa Cruz, CA (US)

(73) Assignee: XILINX, Inc., San Jose, CA (US)

( * ) Notice: Subject to any disclaimer, the term of this patent is extended or adjusted under 35 U.S.C. 154(b) by 397 days.

(21) Appl. No.: 11/147,019

(22) Filed: Jun. 7, 2005

(51) Int. Cl.
*G06F 1/12* (2006.01)
*H04L 5/00* (2006.01)
*H04L 7/00* (2006.01)

(52) U.S. Cl. ...................... 713/400; 713/401
(58) Field of Classification Search ................ 713/400, 713/401
See application file for complete search history.

(56) References Cited

U.S. PATENT DOCUMENTS

| | | | |
|---|---|---|---|
| 4,688,947 A * | 8/1987 | Blaes et al. ................. | 368/120 |
| 6,069,849 A | 5/2000 | Kingsley et al. | |
| 6,144,262 A | 11/2000 | Kingsley | |
| 6,222,407 B1 * | 4/2001 | Gregor ....................... | 327/269 |
| 6,232,845 B1 | 5/2001 | Kingsley et al. | |
| 6,437,597 B1 * | 8/2002 | Chan .......................... | 326/16 |
| 6,452,459 B1 | 9/2002 | Chan et al. | |
| 6,493,851 B1 * | 12/2002 | Bach et al. .................. | 716/4 |
| 6,621,302 B2 * | 9/2003 | Lowy et al. ................ | 326/93 |

OTHER PUBLICATIONS

U.S. Appl. No. 10/126,201, filed Apr. 18, 2002, Chan.
*XILINX, Inc.*, "The Programmable Logic Data Book," 2000, pp. 3-75 to 3-96, available from Xilinx, Inc., 2100 Logic Drive, San Jose, CA. 95124.

\* cited by examiner

*Primary Examiner*—Rehana Perveen
*Assistant Examiner*—Michael J Brown
(74) *Attorney, Agent, or Firm*—W. Eric Webostad

(57) ABSTRACT

A method for determining propagation delay differences for conductive lines of an integrated circuit is described. A first path is formed by coupling a first portion of conductive lines together. The first portion is associated with a first region of the integrated circuit. The first path is coupled in a ring oscillator, and a first delay is determined. A second path is formed by coupling a second portion of the conductive lines together. The second portion is the first portion except for at least a first conductive line in the first portion of the conductive lines being swapped for a second conductive line. The second conductive line is associated with a second region of the integrated circuit. The second path is coupled in the ring oscillator circuit. A second delay is determined, and an incremental difference between the first delay and the second delay may be determined.

10 Claims, 10 Drawing Sheets

METHOD FOR DETERMINING INTERCONNECT LINE PERFORMANCE WITHIN AN INTEGRATED CIRCUIT

FIELD OF THE INVENTION

One or more aspects of the invention relate generally to integrated circuits and, more particularly, to programmable logic devices.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex™ FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserve all copyright rights whatsoever.)

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmably configurable circuitry of an FPGA ("FPGA fabric") as associated with signal propagation delay associated with location of metal lines on a die was determined by forming ring oscillators local to a region of the die between two adjacent rows of CLBs separated by rows of programmable interconnects. This meant that resolution of propagation delay, and thus performance, was determined with at a ring oscillator level. Knowing which interconnect lines have a higher resistance-capacitance as evidenced by a longer propagation delay may be useful in allocating interconnect lines for instantiating a design, or in testing and fault analysis. However, providing a propagation delay measurement with a resolution of a ring oscillator may not be sufficient for some applications where it would be beneficial to characterize propagation delay at various locations on a die with a sub-ring oscillator resolution, Accordingly, it would be desirable and useful to provide means to determine a finer resolution of propagation delay associated with an interconnect line, namely a sub-ring propagation delay resolution.

SUMMARY OF THE INVENTION

One or more aspects of the invention generally relate to integrated circuits and, more particularly, to programmable logic devices.

An aspect of the invention is a method for determining propagation delay differences for a plurality of conductive lines of an integrated circuit. A first signal path is formed from a first portion of the conductive lines by coupling the first portion of conductive lines in series with programmable interconnects. The first portion of the conductive lines is associated with a first region of the integrated circuit. The first signal path is coupled in a ring oscillator circuit. A first signal propagation delay associated with the first signal path is determined. A second signal path is formed from a second portion of the conductive lines by coupling the second portion of the conductive lines with the programmable interconnects. The second portion of the conductive lines is the first portion of the conductive lines except for at least a first conductive line in the first portion of the conductive lines being swapped for a second conductive line not in the first portion of the conductive lines. The second conductive line is associated with a second region of the integrated circuit. The second signal path is coupled in the ring oscillator circuit. A second signal propagation delay associated with the second signal path is determined. An incremental difference between the first signal propagation delay and the second signal propagation delay is determined.

Another aspect of the invention is a method for determining incremental differences in propagation delay. A first plurality of interconnect lines is programmably coupled in series to provide a first signal path. A first end of the first signal path is programmably coupled to a first sequential circuit and a second end of the first signal path is programmably coupled to a second sequential circuit. A first input is received to an input port of the first sequential circuit. The first input is clocked out from a first output port of the first sequential circuit to the first signal path responsive to a clock signal. The first input from the first signal path is received to a clock port of the second sequential circuit, the first input being delayed by the first signal path. A second input received to an input port of the second sequential circuit is clocked out responsive to the first input as delayed by the first signal path. A first propagation delay of the first input associated with traversing the first signal path is determined. A second plurality of interconnect lines is programmably coupled in series to provide a second signal path. The second plurality of interconnect lines is the first plurality of interconnect lines except for at least a first interconnect line in the first plurality of interconnect lines being swapped for a second interconnect line not in the first plurality of interconnect lines. A first end of the second signal path is programmably coupled to the first sequential circuit and a second end of the second signal path is programmably coupled to the second sequential circuit. A third input is received to the input port of the first sequential circuit. The third input is clocked out from the first output port of the first sequential circuit to the second signal path responsive to the clock signal. The third input from the second signal path is received to the clock port of the second sequential circuit. The third input is delayed by the second signal path. A fourth input is clocked out responsive to the third input as delayed by the second signal path. A second propagation delay of the third input associated with traversing the second signal path is determined. The first propagation delay is compared to the second propagation delay to determine a propagation delay difference associated with the first and second signal paths.

Yet another aspect of the invention is a method for comparing propagation delay associated with interconnect lines of an integrated circuit. A first path is formed through the integrated circuit, the first path including a plurality of the interconnect lines. A baseline propagation delay of the first path is determined. At least one interconnect line of the plurality of the interconnect lines is incrementally shifted to provide a bypass path, the incrementally shifting forming a second path through the integrated circuit. A bypass propagation delay of the second path is determined. The baseline propagation delay is compared to the bypass propagation delay to determine an incremental propagation delay associated with the bypass path.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

FIGS. 3A-1 is a lower-level block diagram depicting an exemplary embodiment of the integrated circuit die of FIG. 2B having instantiated therein a propagation delay path.

FIGS. 3A-2 is a block/schematic diagram depicting an exemplary embodiment of the propagation delay path of FIGS. 3A-1.

FIGS. 3A-3 is a block/schematic diagram depicting an exemplary embodiment of the propagation delay path of FIGS. 3A-1 for built-in self testing.

FIGS. 3B-1 is a lower-level block diagram depicting an exemplary embodiment of the integrated circuit die of FIG. 2B having instantiated therein an alternative propagation delay path.

FIGS. 3B-2 is a block/schematic diagram depicting an exemplary embodiment of the propagation delay path of FIGS. 3B-1.

FIGS. 3B-3 is a block/schematic diagram depicting an exemplary embodiment of the propagation delay path of FIGS. 3B-1 for built-in self testing.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
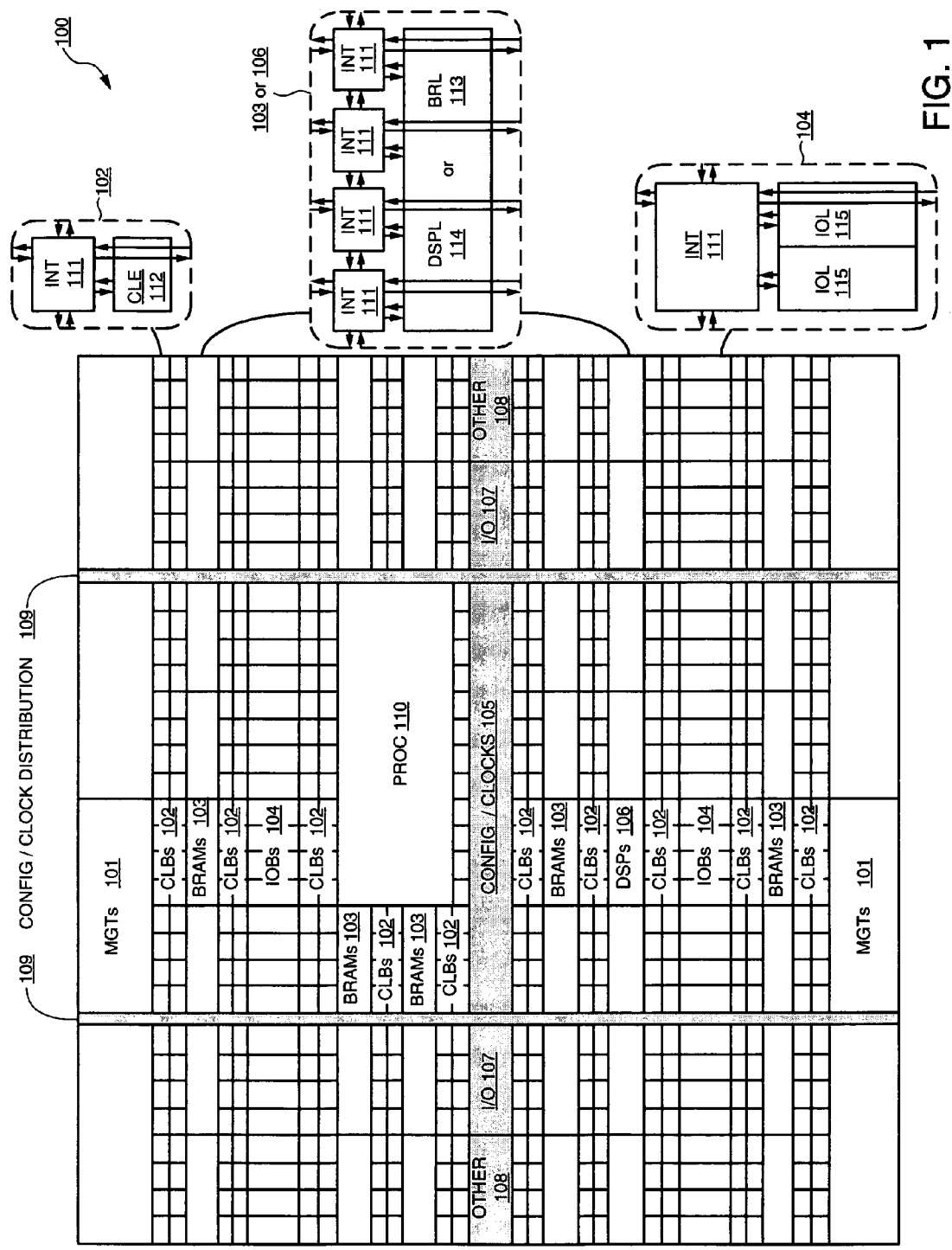
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include one or more dedicated processor blocks ("PROC") 110. FPGA 100 may be used to implement system 100 of FIG. 1. In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2B:
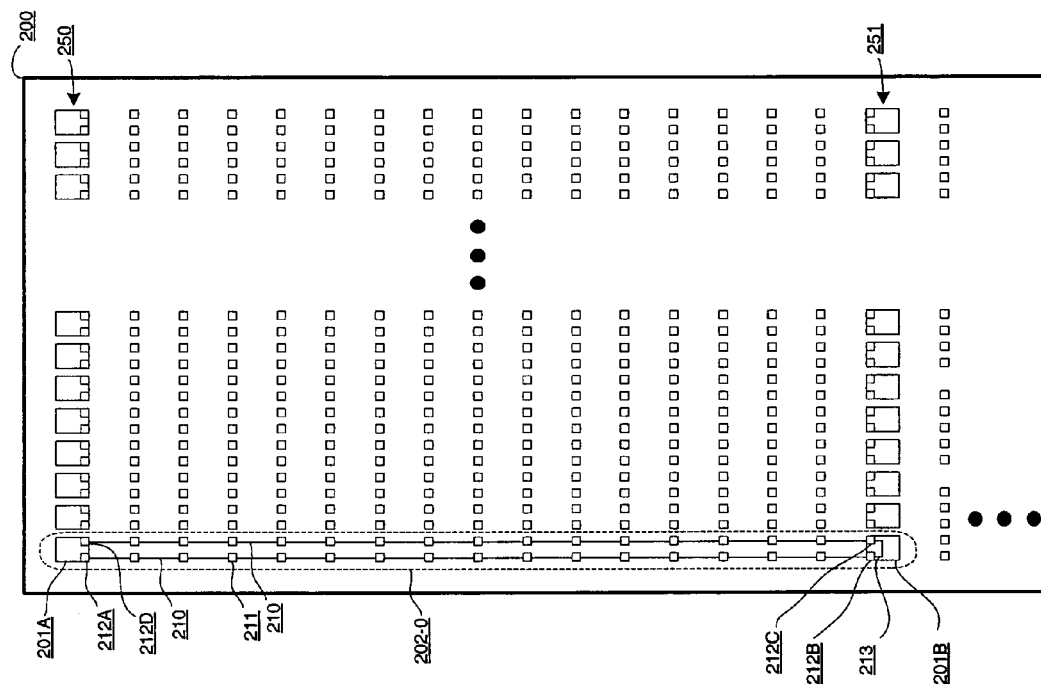
FIG. 2B is a lower-level block diagram depicting an exemplary embodiment of integrated circuit die having a ring oscillator portion instantiated therein.
Figure 2A:
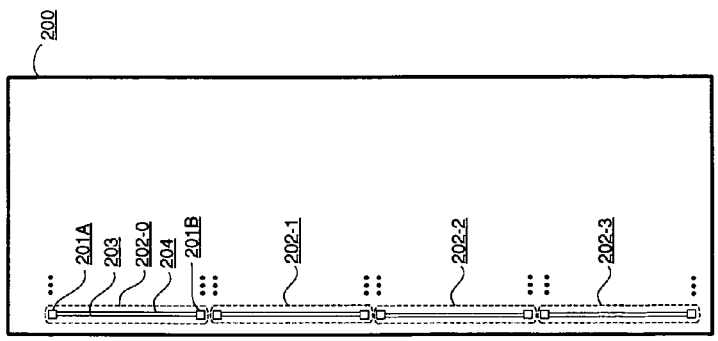
FIG. 2A is a high-level block diagram depicting an exemplary embodiment of a prior oscillator resolution for determining propagation delay.

FIG. 2A is a high-level block diagram depicting an exemplary embodiment of a prior ring oscillator resolution for determining propagation delay. More particularly, flip-flops of CLBs 201A and 202B were coupled together via in part signal paths 203 and 204 to form a ring oscillator portion 202-0. Ring oscillator portion 202-0 may be coupled in a ring oscillator; examples of ring oscillators are described in U.S. Pat. Nos. 6,452,459 B1, 6,232,845 B1, 6,144,262 B1, and 6,069,849 B1. Notably, it should be appreciated that multiple ring oscillators were formed using separate extents of an integrated circuit die 200. Integrated circuit die 200 may be an FPGA as previously described with reference to FIG. 1. Thus, for example, four separate ring oscillator portions 202-0 through 202-3 may be formed to provide a propagation delay resolution associated with each of those ring oscillator portions.

FIG. 2B is a lower-level block diagram depicting an exemplary embodiment of integrated circuit die 200 having ring oscillator portion 202-0 instantiated therein. CLB 201A includes flip-flops 212A and 212D. CLB 201B includes flip-flops 212B and 212C. Flip-flops 212A through 212D are clocked responsive to a clock signal not shown in FIG. 2B. A data output signal from flip-flop 212A is provided to a programmable interconnect element of programmable interconnect elements 211 via an interconnect line 210. As is well-known, multiple programmable interconnect elements 211 may be coupled in series with multiple interconnect lines 210 to form a signal path 203 of FIG. 2A from the output of flip-flop 212A to an input of flip-flop 212B. Output of flip-flop 212B may be provided to an input of flip-flop 212C via a local interconnect line 213, and the output of flip-flop 212C may be provided to an input of flip-flop 212D via programmable interconnect elements 211 and associated interconnect lines 210 coupled in series to form a signal path 204 of FIG. 2A.

Referring to FIGS. 2A and 2B in combination, it should be appreciated that signal path 203 may be provided for propagation delay of a signal from flip-flop 212A to flip-flop 212B, and another signal path 204 may be provided for propagation delay of a signal from flip-flop 212C to flip-flop 212D. Notably, starting flip-flop 212A and ending flip-flop 212D may be internal flip-flops of a ring oscillator circuit, as is known.

With respect to FPGAs, there may be multiple types of interconnect lines. Conventionally these types of interconnect lines are defined by their length and orientation. In particular, interconnect lines 210 may be what are known as vertical hex lines ("V-Hex lines"). However, other types of lines may be used, including horizontal hex lines ("H-Hex lines"), horizontal double lines ("H-Doubles"), and vertical double lines ("V-Doubles"), among other known types of interconnect line configurations. Rather than having resolution limited to ring oscillator portions formed between adjacent rows 250 and 251 of CLBs, a finer resolution may be provided as described with reference to the following figures. Notably, the particular examples of types of interconnect lines, such as hex lines and double lines are provided for purposes of clarity by way of example and not limitation. Accordingly, it should be appreciated that any interconnect line or lines that may be used to substitute for or bypass another interconnect line or lines may be used.

Figures 1, 3B:
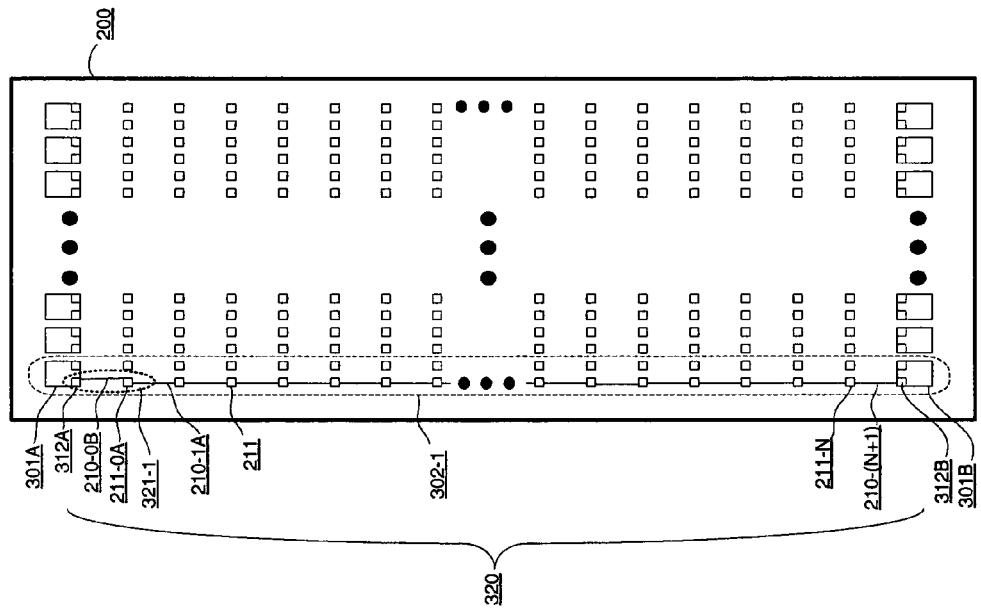
Figures 1, 3A:
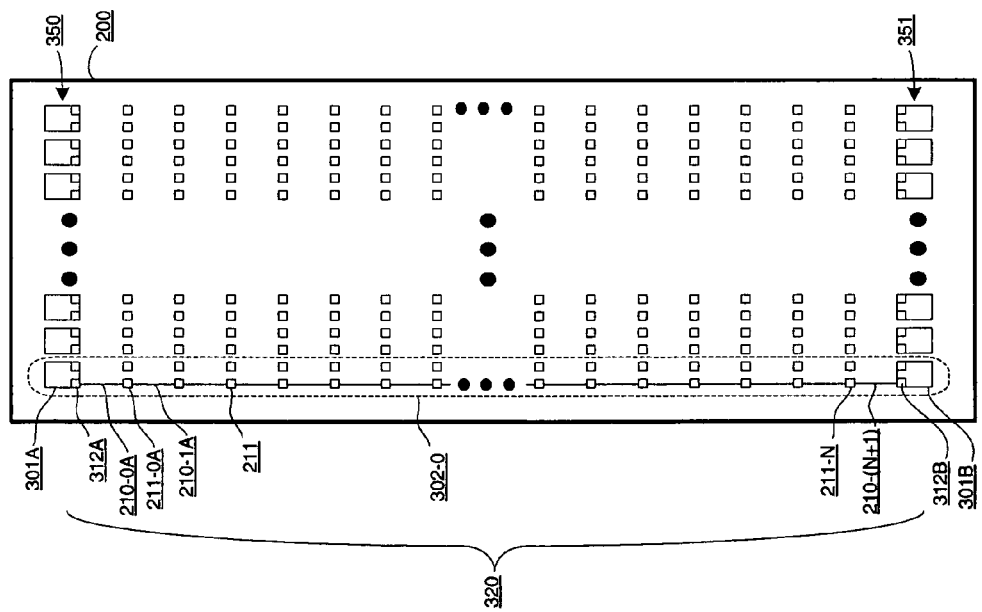

FIGS. 3A-1 is a lower-level block diagram depicting an exemplary embodiment of an integrated circuit die 200 having instantiated therein a propagation delay path 302-0. Notably, propagation delay path 302-0 may extend an internal length 320 of integrated circuit die 200. Though internal length 320 substantially extends the entire length of integrated circuit die 200, it need not be so long. However, it will be appreciated from the following description that finer increments of propagation delay may be measured as associated with variations of propagation delay path 302-0. Thus, by not breaking propagation delay paths up into sections extending between adjacent rows of CLBs, fewer CLB resources may be used and propagation delay may be associated with a more specific interconnect line or plurality of interconnect lines of integrated circuit die 200. In other words, a subset of a set of interconnect lines forming in part a signal path from one flip-flop to another flip-flop in a ring oscillator may be used to characterize incremental propagation delay associated with such subset.

CLB 301A includes a flip-flop 312A. Output of flip-flop 312A is provided to an initial interconnect line 210-0A which is coupled to an initial programmable interconnect element 211-0A. Notably, there may be N, for N a positive integer greater than 1, programmable interconnect elements 211 and N+1 interconnect lines 210 coupled in series to provide propagation delay path 302-0, where propagation delay path 302-0 is used to couple an output from flip-flop 312A of CLB 301A to an input of flip-flop 312B of CLB 301B. Notably, in the embodiment, rows 350 and 351 of CLBs need not be and are not adjacent rows, though intervening rows are not illustratively shown for purposes of clarity. However, rows 350 and 351 may be adjacent rows, at the expense of consuming additional CLB resources to determine propagation delay for regions of integrated circuit die 200.

Figures 2, 3A:
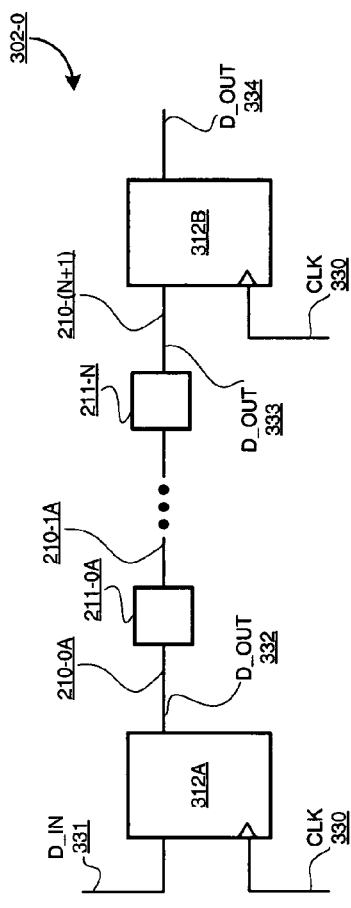

FIGS. 3A-2 is a block/schematic diagram depicting an exemplary embodiment of propagation delay path 302-0 of FIGS. 3A-1 configured for cycle time testing. Notably, data input signal 331 is provided to a data input port of flip-flop 312A, and a clock signal 330 used to clock flip-flop 312A is provided to a port thereof. Clock signal 330 is also used to clock flip-flop 312B. The configuration illustratively shown in FIGS. 3A-2 may be used for a Minimum Cycle Time ("MCT") test. MCT testing is described in additional detail in a co-pending patent application entitled "Circuits and Methods for Measuring Signal Propagation Delays on Integrated Circuits" Ser. No. 10/126,201, by Siuki Chan, filed Apr. 18, 2002.

Data output signal 332 from flip-flop 312A is provided via interconnect line 210-0A to programmable interconnect element 211-0A. Signal 332 propagates along other interconnect lines, including interconnect line 210-1A coupled to programmable interconnect element 211-0A, and through other programmable interconnect elements of propagation delay path 302-0 including a last programmable interconnect element 211-N and a last interconnect line 210-(N+1) for input of data output signal 333, namely a propagation delayed version of data output signal 332, to flip-flop 312B. Output from flip-flop 312B is data output signal 334. Thus, by coupling propagation delay path 302-0 in a ring oscillator, propagation delay of data input signal 331 as associated with clock signal 330 traversing such propagation delay path to become data output signal 334 may be determined. More particularly, the actual delay need not be determined but may be used as a baseline delay to which other delays are compared to determine propagation delay difference.

Figures 3, 3A:
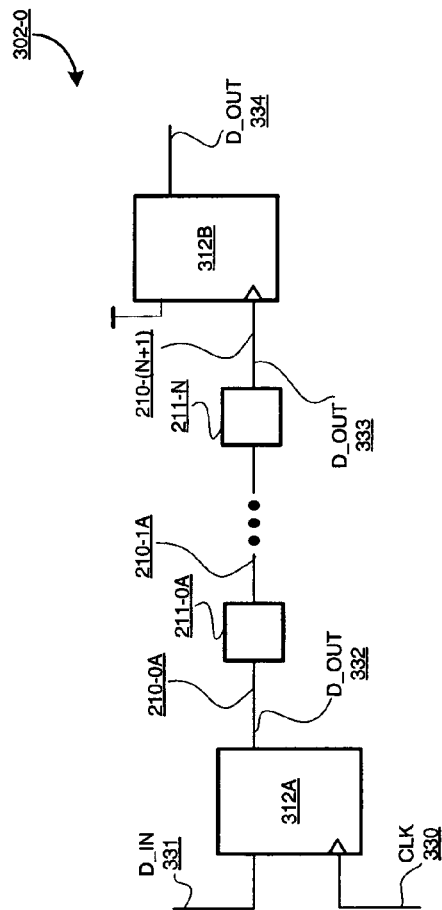
Figures 2, 3B:
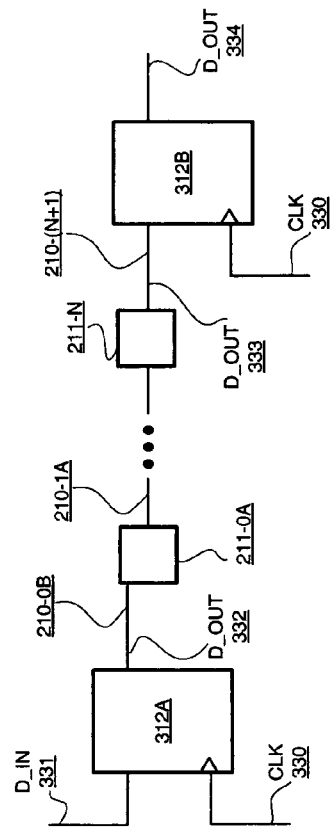
Figures 3, 3B:
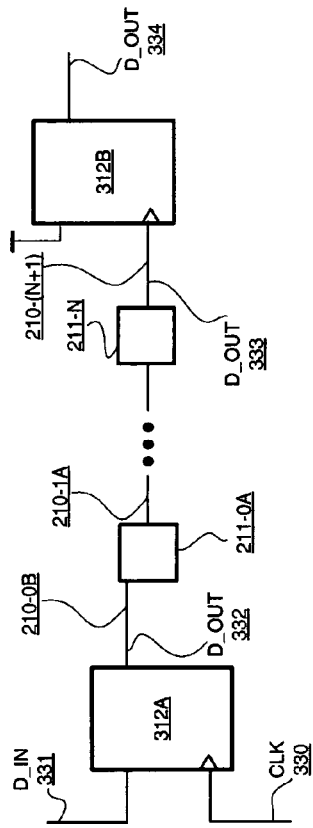

FIGS. 3A-3 is a block/schematic diagram depicting an exemplary embodiment of propagation delay path 302-0 of FIGS. 3A-1 for built-in self testing. Propagation delay path 302-0 of FIGS. 3A-3 may be coupled in a ring oscillator. Propagation delay path 302-0 of FIGS. 3A-3 is the same as propagation delay path 302-0 of FIGS. 3A-2, except that data output signal 333 is provided to a clock port of flip-flop 312B instead of clock signal 330, and that data output signal 333 is not provided to a data input port of flip-flop 312B. Thus, delay as between clocking flip-flop 312A to clocking flip-flop 312B may be determined to calculate a delay associated with propagation path 302-0 of FIGS. 3A-3. Notably, though a data input port of flip-flop 312B is schematically shown as coupled to Vdd, the data input port of flip-flop 312B need not be coupled to Vdd but may be coupled to another voltage level or to receive a signal.

FIGS. 3B-1 is a lower-level block diagram depicting an exemplary embodiment of integrated circuit die 200 having instantiated therein a propagation delay path 302-1. Propagation delay path 302-1 is propagation delay path 302-0 with a bypass path 321-1. Instead of instantiating coupling of output of flip-flop 312A to programmable interconnect element 211-0A via interconnect line 210-0A as illustratively shown in FIGS. 3A-1 and 3A-2, interconnect line 210-0A is bypassed by coupling output of flip-flop 312A via interconnect line 210-0B to programmable interconnect element 211-0A. The remainder of propagation delay path 302-1 may be the same as propagation delay path 302-0. Thus, any incremental difference between propagation delay path 302-0 and 302-1 as respectively associated with respective use of interconnect line 210-0A and 210-0B may be determined.

FIGS. 3B-2 is a block/schematic diagram depicting an exemplary embodiment of propagation delay path 302-1 of FIGS. 3B-1 configured for cycle time testing. As much of the description of propagation delay path 302-1 is the same as that for propagation delay path 302-0, it is not repeated here for purposes of clarity. Rather, the differences are described. Data output signal 332 from flip-flop 312A is provided via interconnect line 210-0B to programmable interconnect element 211-0A. Output of programmable interconnect element 211-0A is provided along the remainder of propagation delay path 302-1 for input to flip-flop 312B.

FIGS. 3B-3 is a block/schematic diagram depicting an exemplary embodiment of propagation delay path 302-1 of FIGS. 3B-1 for built-in self testing. Propagation delay path 302-0 of FIGS. 3B-3 is the same as propagation delay path 302-1 of FIGS. 3B-2, except that data output signal 333 is provided to a clock port of flip-flop 312B instead of clock signal 330, and that data output signal 333 is not provided to a data input port of flip-flop 312B. Thus, delay as between clocking flip-flop 312A to clocking flip-flop 312B may be determined to calculate a delay associated with propagation path 302-1 of FIGS. 3B-3. Again, notably, though a data input port of flip-flop 312B is schematically shown as coupled to Vdd, the data input port of flip-flop 312B need not be coupled to Vdd but may be coupled to another voltage level or to receive a signal.

Referring to FIGS. 3A-1 and 3B-1, it should be appreciated that propagation delay path 302-0 may be formed with metal lines associated with a column of metal lines of integrated circuit die 200. It should be further appreciated that propagation delay path 302-1 may be associated with metal lines of the same column as that shown with reference to propagation delay path 302-0 as well as an additional column as associated with interconnect line 210-0B. Thus, there may be an incremental delay difference between propagation delay paths 302-0 and 302-1. This incremental delay difference may be associated with a particular interconnect line. Furthermore, this particular interconnect line is located along a particular region of integrated circuit die 200. Thus, it should be understood that signal propagation delay associated with a particular interconnect line and thus a particular metal line of a die may be determined for obtaining an understanding of the regional effects of propagation delay due to a metal line, as well as which metal lines may perform better or worse than others. Furthermore, it should be understood that different metal line layers may be taken into account for the purpose of determining associated signal propagation delay.

Figure 3C:
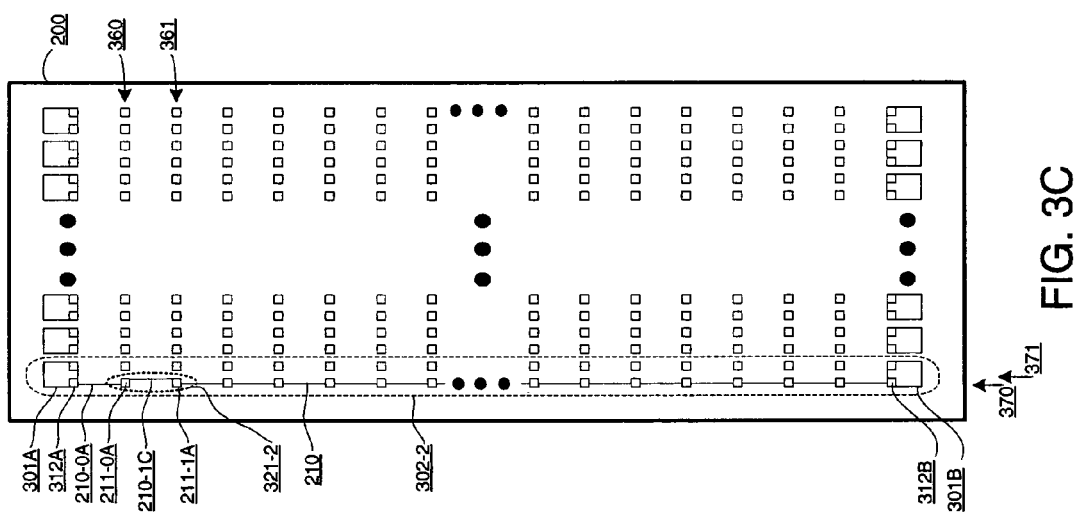
FIG. 3C is a lower-level block diagram depicting an exemplary embodiment of the integrated circuit die of FIG. 2B having instantiated therein another alternative propagation delay path.

FIG. 3C is a lower-level block diagram depicting an exemplary embodiment of integrated circuit die 200 having instantiated therein a propagation delay path 302-2. Propagation delay path 302-2 is the same as propagation delay path 302-0 though with a bypass path 321-2. In this example, output from flip-flop 312A is provided to interconnect line 210-0A for programmable interconnect element 211-0A. However, output from programmable interconnect element 211-0A is provided via interconnect line 210-1C, instead of interconnect line 210-1A of FIGS. 3A-2 or 3A-3, to programmable interconnect element 211-1A. The remainder of propagation delay path 302-2 is the same as propagation delay path 302-0.

Figure 3D:
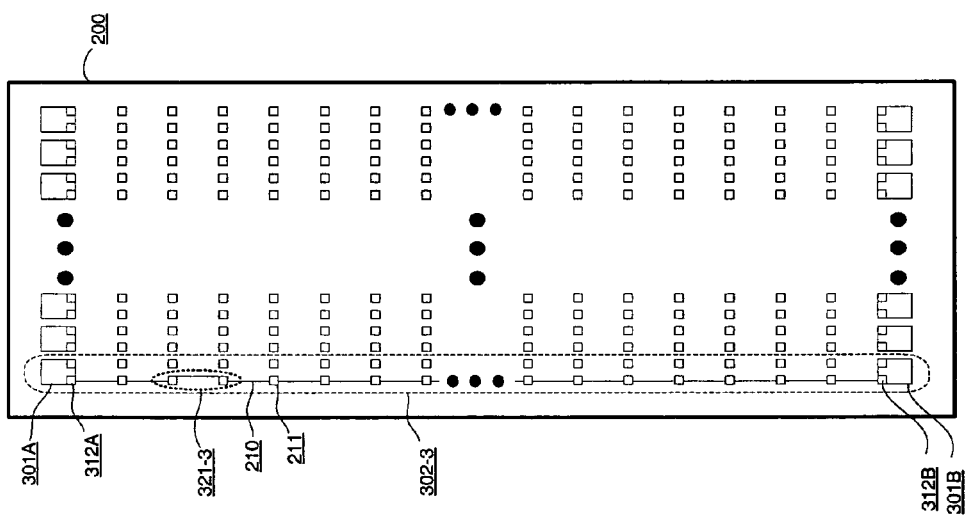
FIG. 3D is a lower-level block diagram depicting an exemplary embodiment of the integrated circuit die of FIG. 2B having instantiated therein a bypass path between a second and a third row of programmable interconnect elements.
Figure 3E:
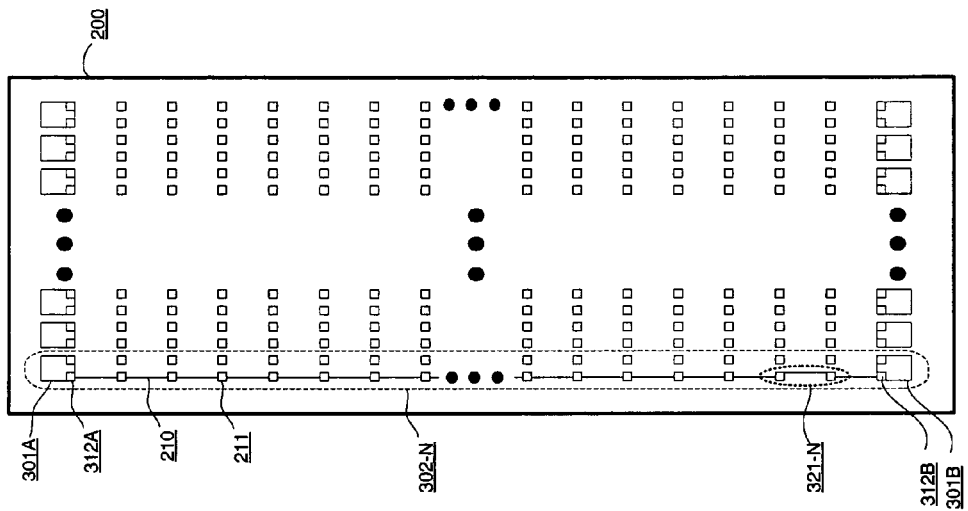
FIG. 3E is a lower-level block diagram depicting an exemplary embodiment of the integrated circuit die of FIG. 2B having instantiated therein an Nth bypass path.
Figure 3F:
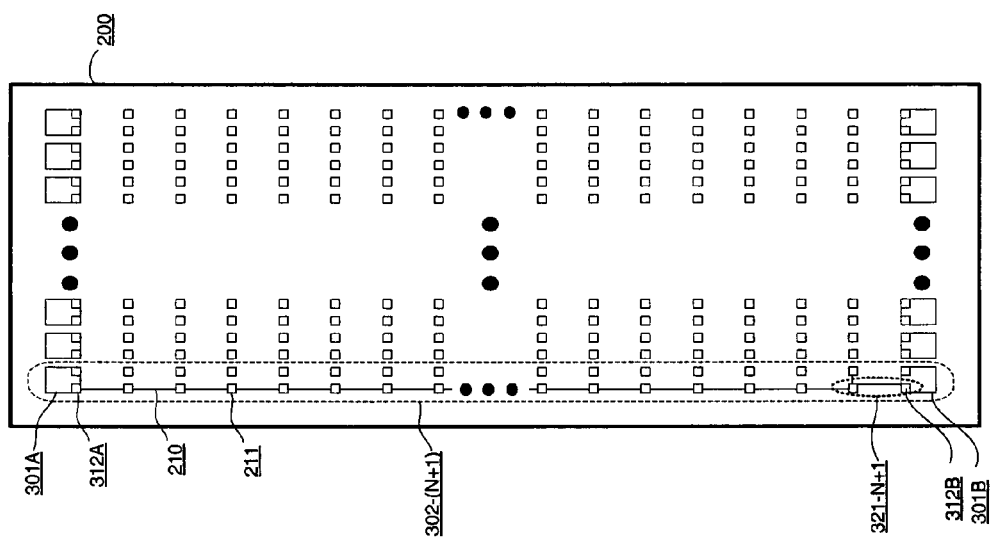
FIG. 3F is a lower-level block diagram depicting an exemplary embodiment of the integrated circuit die of FIG. 2B having instantiated therein an N+1th bypass path, such as from a last row of programmable interconnect elements to a flip-flop.

Thus, it should be understood that an interconnect line between a first row 360 and a second row 361 of programmable interconnect elements is different as between propagation delay paths 302-0 and 302-2. In propagation delay path 302-0, the interconnect between programmable interconnect elements of these two rows 360 and 361 is in a first column 370 of interconnect lines 210, and in a propagation delay path 302-2, the interconnect between these two rows 360 and 361 is in a second column 371 of interconnect lines 210. Thus, it should be understood that each bypass path may be incrementally shifted with reference to a baseline propagation delay path, such as propagation delay path 302-0. In this manner, incremental delay associated with an interconnect line in a column adjacent to the column of interconnects used to form the baseline path may be determined. For example, in FIG. 3D, a next bypass path 321-3 of a propagation delay path 302-3 is illustratively shown between a second and a third row of programmable interconnect elements 211. The propagation delay path may be incremented to provide an Nth bypass path, such as bypass path 321-N of propagation delay path 302-N, as illustratively shown in FIG. 3E. Furthermore, a bypass path 321-(N+1) of propagation delay path 302-(N+1), such as from a last row of programmable interconnect elements to flip-flop 312B, may be instantiated as illustratively shown in FIG. 3F. In general, any one or more interconnect lines 210 of a given propagation delay path may be replaced by one or more lines that are incrementally shifted to produce a bypass path.

Figure 5:
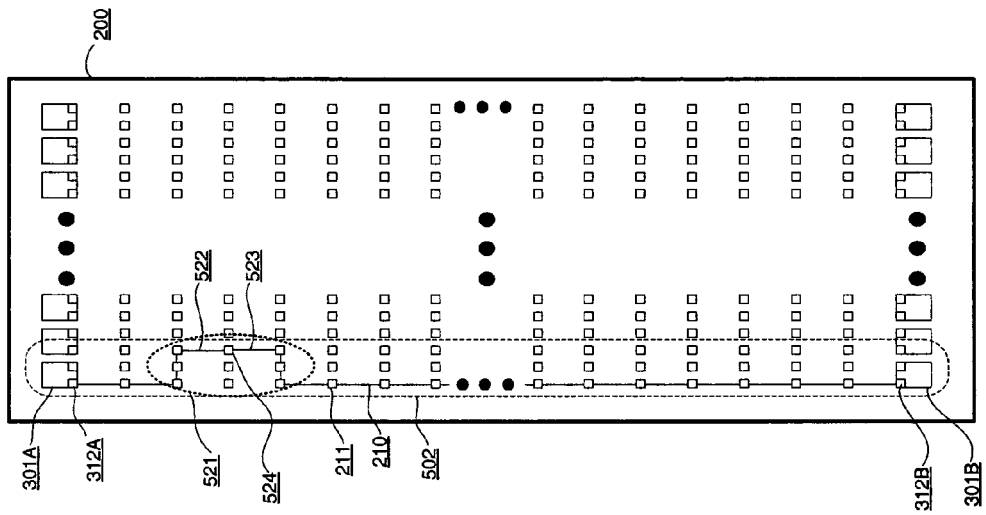
FIG. 5 is a lower-level block diagram depicting an exemplary embodiment of still another propagation delay path instantiated in the integrated circuit die of FIG. 2B.
Figure 4:
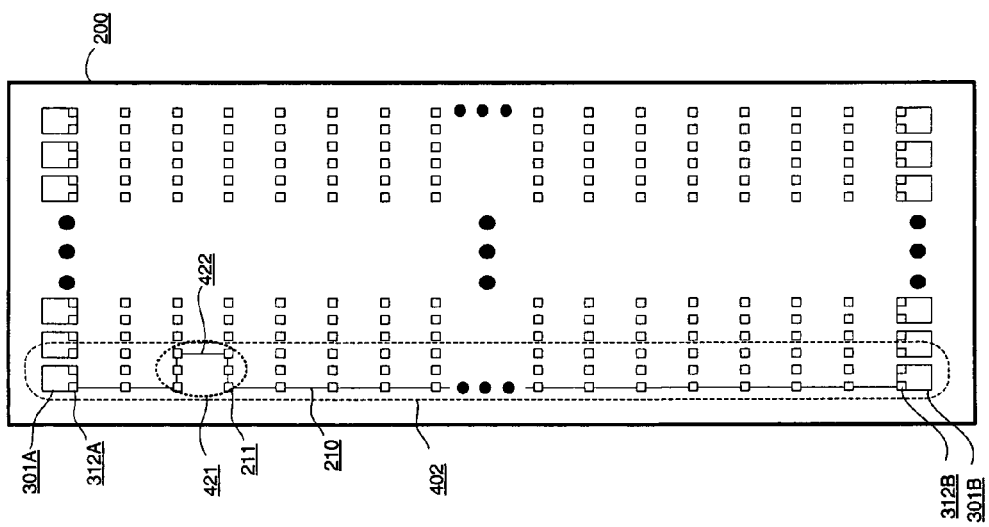
FIG. 4 is a lower-level block diagram depicting an exemplary embodiment of still another propagation delay path instantiated in the integrated circuit die of FIG. 2B.

Though the above description has been in terms of adjacent columns of interconnect lines and adjacent rows of programmable interconnect elements, it should be understood that other propagation delay incremental differences may be used. For example, in FIG. 4, there is shown a lower-level block diagram depicting an exemplary embodiment of a propagation delay path 402 instantiated in integrated circuit die 200. Propagation delay path 402 has a bypass path 421, where an interconnect 422 between a second row and a third row of programmable interconnect elements is between two programmable interconnect elements of a third column of programmable interconnect elements. Thus, it should be appreciated that interconnect lines need not be in adjacent columns in order to determine an incremental delay associated with a baseline propagation delay path. Furthermore, it should be appreciated that more than one interconnect line may be used to provide an incremental delay difference. For example, in FIG. 5, there is shown a lower-level block diagram depicting an exemplary embodiment of a propagation delay path 502 instantiated in integrated circuit die 200. Propagation delay path 502 has a bypass path 521 where two interconnect lines 522 and 523 are coupled in series via programmable interconnect element 524 to provide bypass path 521. Again, in this example, it is shown that interconnect lines, such as interconnect lines 522 and 523, may be in a column which is not adjacent to a baseline propagation delay column of interconnect lines.

Notably, a modification to a propagation delay path need not be in a different column or a different row of a die. For example, the modified propagation delay path may be a metal line in the same CLB column as the base propagation delay path, but the modification may employ a different metal line in a bus of available interconnects, for example such as a bus of hex lines, a bus of double lines, or a bus of other known interconnect lines.

Figure 6:
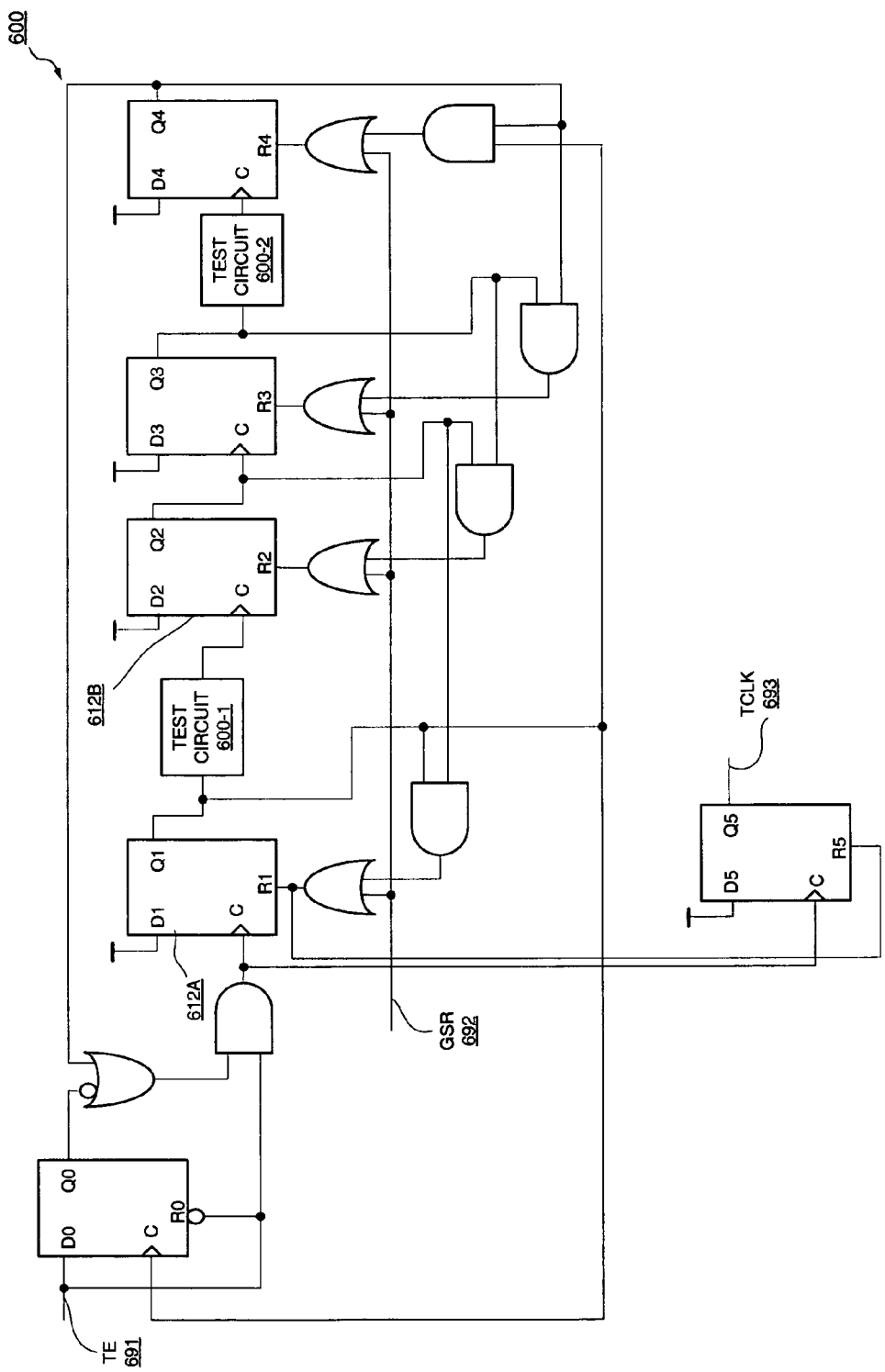
FIG. 6 is a block/schematic diagram depicting an exemplary embodiment of a ring oscillator having two test circuits.

FIG. 6 is a block/schematic diagram depicting an exemplary embodiment of a ring oscillator 600 having test circuits 600-1 and 600-2. A test activation signal ("TE") 691 and a global set/reset ("GSR") signal 692 may be applied to ring oscillator 600. Ring oscillator 600 may output a test clock ("TCLK") signal 693. Aside from using propagation delay paths as described elsewhere herein as one or more test circuits, such as test circuits 600-1 and 600-2, ring oscillator 600 is described in detail in the U.S. patents referenced above.

Test circuit 600-1 may be used exclusive of test circuit 600-2, or both test circuits 600-1 and 600-2 may be used together. For clarity, it shall be assumed that only test circuit 600-1 is used. A signal propagation delay path, as described with reference to any FIGS. 3A-1, 3B-1, 3C through 3F, 4, and 5, may be implemented as test circuit 600-1. Alternatively, flip-flops 312A and 312B may be respectively replaced with flip-flops 612A and 612B, where output of flip-flop 612A (312A) is provided to clock flip-flop 612B (312B) after passing through a series of interconnect lines coupled via programmable interconnect elements to provide a propagation delay path as previously described.

Thus, a series of test circuits 600-1 may be implemented and tested to determine propagation delay for each, and results from each test may be compared against one another to determine any incremental differences in propagation delay as respectively associated with each bypass path implemented.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for determining incremental differences in propagation delay comprising:
   determining a first propagation delay by:
      programmably coupling a first plurality of interconnect lines in series to provide a first signal path;
      programmably coupling a first end of the first signal path to a first sequential circuit and a second end of the first signal path to a second sequential circuit;
      receiving a first input to an input port of the first sequential circuit;
      clocking out the first input from a first output port of the first sequential circuit to the first signal path responsive to a clock signal;
      receiving the first input from the first signal path to a clock port of the second sequential circuit, the first input being delayed by the first signal path;
   clocking out a second input received to an input port of the second sequential circuit responsive to the first input as delayed by the first signal path; and
      determining the first propagation delay of the first input associated with traversing the first signal path;
   determining a second propagation delay by:
      programmably coupling a second plurality of interconnect lines in series to provide a second signal path, the second plurality of interconnect lines being the first plurality of interconnect lines except for at least a first interconnect line in the first plurality of interconnect lines being swapped for a second interconnect line not in the first plurality of interconnect lines;
      programmably coupling a first end of the second signal path to the first sequential circuit and a second end of the second signal path to the second sequential circuit;
      receiving a third input to the input port of the first sequential circuit;
      clocking out the third input from the first output port of the first sequential circuit to the second signal path responsive to the clock signal;
      receiving the third input from the second signal path to the clock port of the second sequential circuit, the third input being delayed by the second signal path;
      clocking out a fourth input responsive to the third input as delayed by the second signal path; and
      determining the second propagation delay of the third input associated with traversing the second signal path; and comparing the first propagation delay to the second propagation delay to determine a propagation delay difference associated with the first and second signal paths.

2. The method according to claim 1, wherein the at least a first interconnect line is associated with a first region of an integrated circuit, and wherein the second interconnect line is associated with a second region of the integrated circuit.

3. The method according to claim 2, wherein the first sequential circuit is a first flip-flop, and wherein the second sequential circuit is a second flip-flop.

4. The method according to claim 3, wherein the first flip-flop is part of a first configurable logic block, and wherein the second flip-flop is part of a second configurable logic block.

5. The method according to claim 4, wherein the first configurable logic block is part of an initial row of configurable logic blocks, the initial row of configurable logic blocks being associated with a perimeter of an array of configurable logic blocks of the integrated circuit.

6. The method according to claim 5, wherein the second configurable logic block is part of a last row of configurable logic blocks, the last row of configurable logic blocks being associated with the perimeter of the array of configurable logic blocks.

7. The method according to claim 6, wherein the integrated circuit is a programmable logic device.

8. The method according to claim 7, wherein the programmable logic device is a field programmable gate array.

9. The method according to claim 8, wherein the first plurality and the second plurality of interconnect lines are respective pluralities of metal lines.

10. The method according to claim 8, wherein the first plurality and the second plurality of interconnect lines are respective pluralities selected from the group consisting of hex lines and double lines.

* * * * *